United States Patent [19]

Harrison et al.

[11] Patent Number: 5,668,823
[45] Date of Patent: Sep. 16, 1997

[54] INJECTION LASER ASSEMBLY INCORPORATING A MONITOR PHOTOSENSOR

[75] Inventors: Paul Mark Harrison, Springfield; Robert George Peall, Harlow; Terry Victor Clapp, Standon, all of United Kingdom

[73] Assignee: Northern Telecom Limited, Montreal, Canada

[21] Appl. No.: 560,312

[22] Filed: Nov. 17, 1995

[30] Foreign Application Priority Data

Nov. 18, 1994 [GB] United Kingdom .............. 9423282

[51] Int. Cl.[6] .............. H01S 3/098; H01S 3/19; G02B 6/32
[52] U.S. Cl. .............. 372/50; 385/34; 372/19
[58] Field of Search .............. 372/50, 43, 19; 385/14, 35, 34

[56] References Cited

U.S. PATENT DOCUMENTS

| 4,583,226 | 4/1986 | Liou | 372/19 |
| 4,854,659 | 8/1989 | Hammerslag et al. | 385/14 |
| 4,983,009 | 1/1991 | Musk | 385/35 |

Primary Examiner—Rodney B. Bovernick
Assistant Examiner—Luong-Quyen T. Phan
Attorney, Agent, or Firm—Lee, Mann, Smith, McWilliams, Sweeney & Ohlson

[57] ABSTRACT

An injection laser assembly mounted upon a crystal substrate [10] employing a back facet monitor is disclosed. A graded index lens [34] focuses light from the, typically, high in diversion and low intensity rays output from the back facet of the laser [30]. To allow repeatable and efficient coupling the graded index lens [34] is mounted within a groove defined in the crystal. Several configurations for mounting a photodiode sensor [P1,P2] are possible.

7 Claims, 3 Drawing Sheets

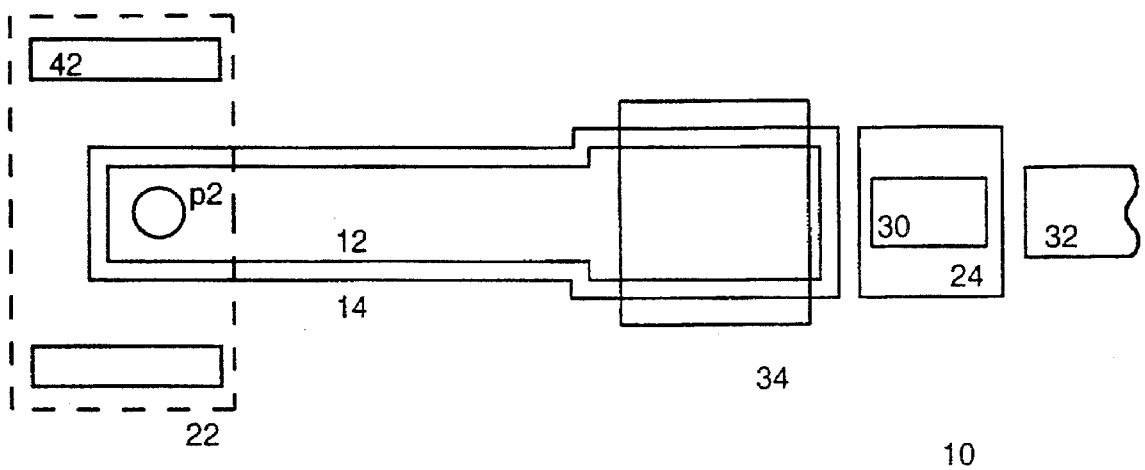
Figure 5
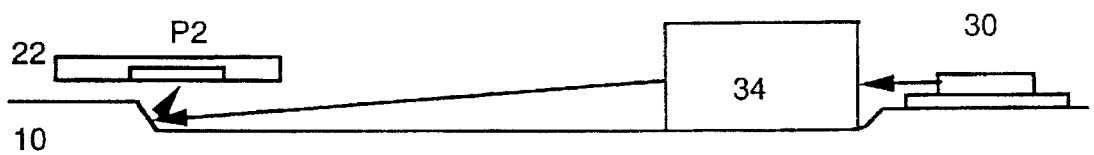
Figure 6
Figure 7
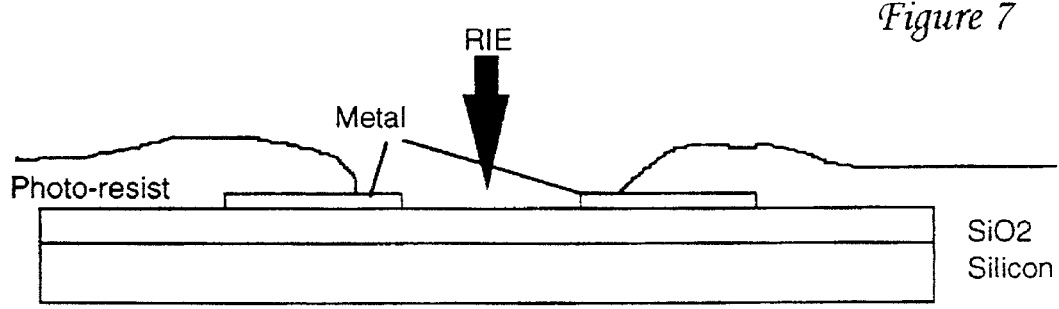
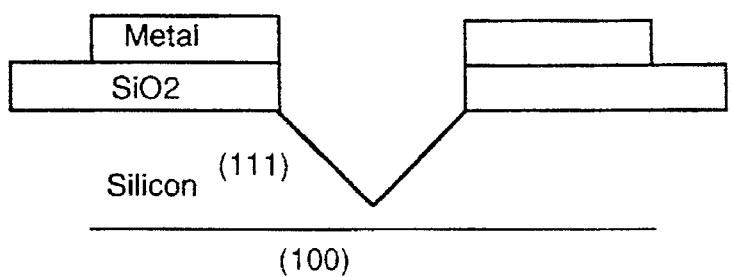
Figure 8

INJECTION LASER ASSEMBLY INCORPORATING A MONITOR PHOTOSENSOR

FIELD OF THE INVENTION

The present invention relates to semiconductor lasers and in particular to an injection laser assembly incorporating a monitor photosensor.

BACKGROUND TO THE INVENTION

The use of a monitor photosensor, such as a photodiode, positioned to receive light emitted from the rear facet of an injection laser is well known, such a monitor photosensor typically being used to regulate the electrical drive in such a way as to stabilise the light output of the laser.

For some applications the photosensor is required to have a fast response, and this usually entails a construction of photosensor with a relatively small area of photoresponsive surface, which may typically, have a diameter of less than 50 µm and may be located between 2 and 4 mm from the rear facet of the laser chip. To concentrate sufficient optical power from the laser's rear facet within an area of this size at this distance requires some form of imaging optics, either a lens, a mirror, or both.

Sphere lenses are frequently used with SLEDs and ELEDs and can have a diameter as small as 0.3 mm. Lasers have active regions of around 50 nm and cannot couple successfully with such sphere lenses. The image of the rear facet of the laser on the lens would lie a long way below the principal axis of the lens resulting in an acute transmission angle through the lens and a consequently large image size. One way of using a focusing reflector to direct light from an injection laser on to a photodiode is described in EP-A-0294167. The reflector in that instance is specifically arranged to be deformable so as to allow optimisation of the optical coupling between source and detector. Adjustment of this sort is performed on an individual basis whilst actively monitoring the optical coupling achieved, and thus is both time consuming and costly. Furthermore, the use of such techniques may introduce long-term stability problems. U.S. Pat. No. 4,293,826 (Xerox) provides a laser detector arrangement wherein the optical detector is integral with the substrate and aligned at oblique angles relative to the path of light from one of the light emitting facets of the laser. This arrangement does not focus the light and accordingly fast response photo-diodes cannot be used since such photo-diodes have small active areas. Feedback control is thus not possible for high bit-rates.

The present invention seeks to provide an improved coupling arrangement for the back facet emissions of an injection laser.

SUMMARY OF THE INVENTION

According to the present invention there is provided an injection laser assembly comprising a single crystal substrate upon which an injection laser is mounted, which substrate is provided with a machined or an etched V-groove in which is located a graded index lens positioned to direct laser back facet emissions at a sensor arranged on the substrate.

This coupling arrangement is passive in the sense that the relative alignment of the piece-parts that regulate the optical coupling between the injection laser and the photosensor is achieved without recourse to any active monitoring of the optical coupling. The high coupling efficiency of the graded index lens can ensure that the predetermined nature of the location of the piece-parts does not prejudice the coupling efficiency. That is, the position of the lens is determined by the V-groove, the dimensions of which can be easily and repeatably controlled. The graded index lens can thereby be attached in a predetermined bump-stop fashion. Furthermore, the use of a grin lens perovides a focussed image spot enabling the use of a fast photo-diode. Imaging is possible both above and below the plane of the substrate.

In order that the invention may be more fully understood, reference will now be made to the figures, wherein:

BRIEF DESCRIPTION OF THE DRAWINGS

FIG. 5 is a plan view of a detection arrangement employing a flip-chip photodiode;

FIG. 6 shows a sectional view through an embodiment employing a flip-chip photodiode;

FIG. 7 shows a section through an unetched silicon substrate having a silicon oxide channel, and FIG. 8 shows a silicon substrate having a silicon oxide layer and self-aligning metallic contact regions.

DETAILED DESCRIPTION OF A PREFERRED EMBODIMENT

Figure 1:
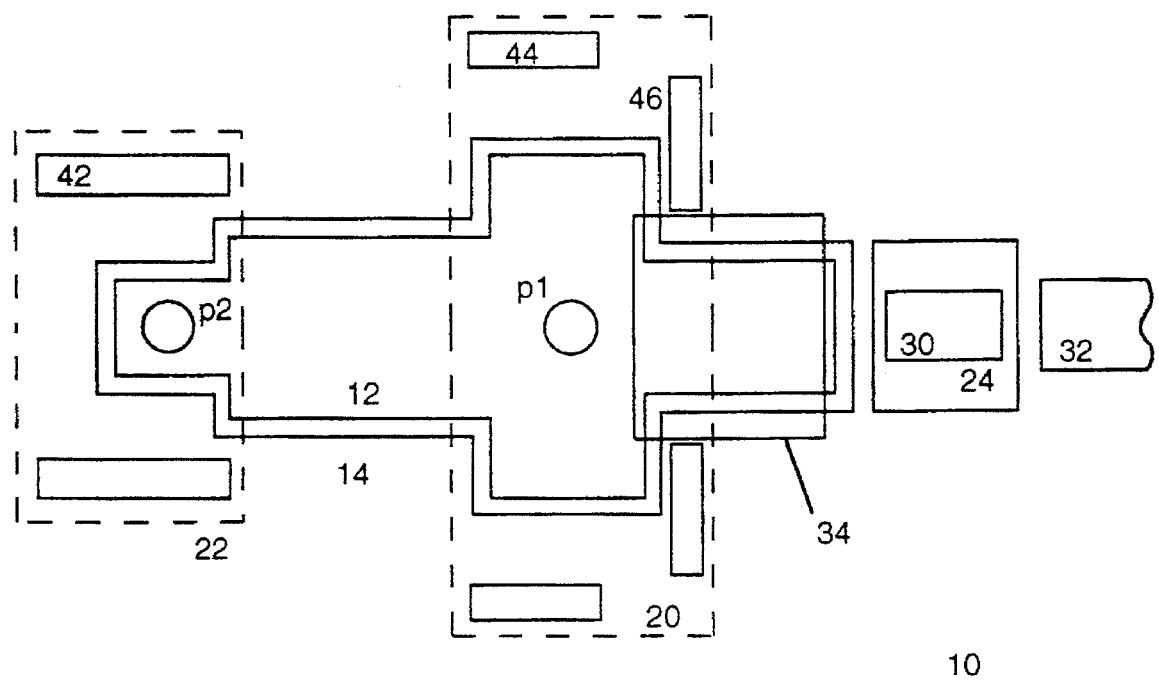
FIG. 1 is a plan view of a substrate made in accordance with the invention showing alternative mounting positions for a photodiode.

Referring now to FIG. 1, there is shown a silicon substrate 10 with a laser 30 mounted on a pad portion 24 with the front face of the laser 30 arranged to transmit signals via optical fibre 32. The laser chip is preferably solder bump aligned on the silicon substrate and using a typical MQW-DFB laser structure will result in a back facet emission region approximately 13 µm above the silicon lower surface (taking into account the metallisation of the MQW-DFB arrangement).

The substrate 10 has several etched positions 12, 42, 44 and 46. Etched portion 12 defines a substantial V-groove channel portion for placement of a photodiode in one of two positions, P1, P2 and for the positioning of the lens 34. Etched portions 42, 44, 46 define channels for the positive location of hybrid elements such as a mirror substrate 20 or a flip-chip photodiode on entry substrate 22. These substrates 20, 22 have corresponding channels or grooves and are positioned to receive fibre stubs. The fibre stubs (not shown) ensure correct alignment of the substrates 20, 22 and are fixed by adhesive. A controlled etch to a depth of typically 100 µm is made which may approach to within 30 µm of the laser mounting position. Lens 34 is a cylindrical, graded index lens which is positioned in the etched groove portion 12 to receive back facet radiation from the laser. Assuming that the etched groove is 100 µm deep, then the use of a graded index lens comprising a multimode fibre stub of 300 µm diameter allows the laser facet to emit radiation about 37 µm below the axis of the lens. The periodicity of the lens will thus provide a method of directing the image of the facet alternately above and below the axis of the lens.

Silicon V-groove etching is carried out using lithographic mask definition of windows through which the differential etch rate of the silicon in for example, alcoholic solutions of basic hydroxides or ethylene diamine and piperazine yield self-limiting grooves or troughs with angled or faceted walls and optionally, (if the etch time is reduced) a flat base. Hydrazine or generally anisotropic etches can also be used. Since the V-grooves are formed by well known techniques, only an overview of the process will be given below.

Firstly a silicon oxide or nitride coating is deposited at a thickness of 0.2 to 2.0 µm on a silicon substrate. A photoresist solution is applied and developed after being exposed to a lithographic pattern. Reactive Ion Etchants (RIE) react with the exposed oxide or nitride to define the etching aperture (see FIG. 7). Alternatively an intermediate patterned metal layer may be introduced which defines both the position of the laser pad and the etching aperture resulting in the groove being self aligned. After RIE and removal of residual photoresist the substrate is subjected to a wet etch of the silicon substrate (see FIG. 8). The resulting product comprises a silicon substrate with a V-groove with the angles of the side walls of the V-groove being determined by {111} planes.

Figure 2:
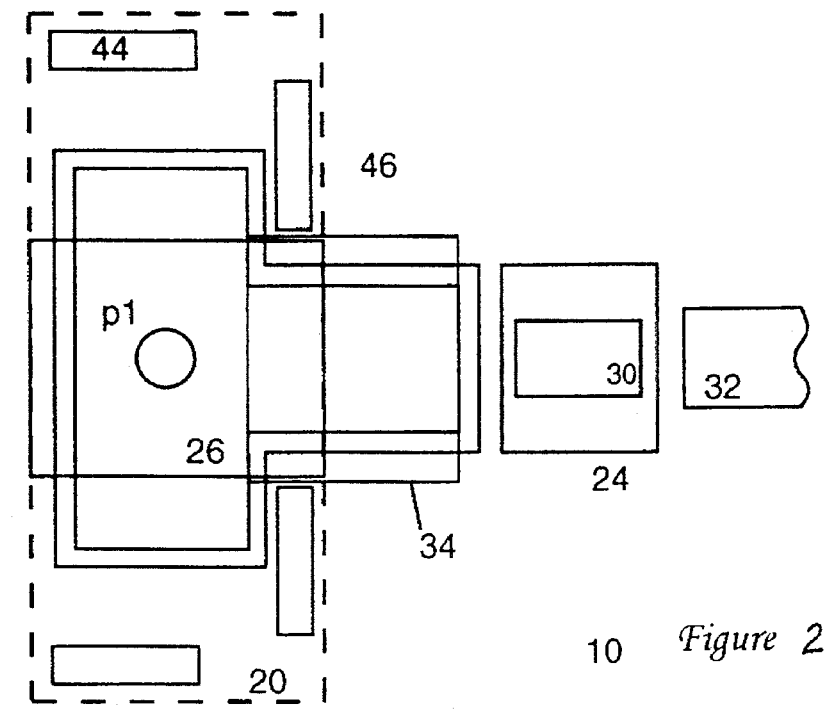
FIG. 2 shows a plan view of a substrate for mounting a reflector in combination with a submerged photodiode.
Figure 3:
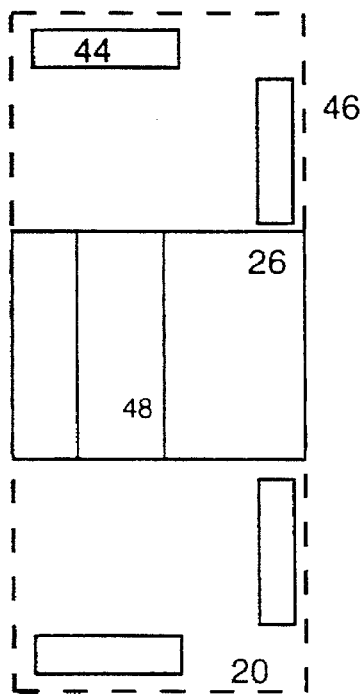
FIGS. 3 and 4 detail the reflector substrate of FIG. 2 in plan and cross sectional views respectively.
Figure 4:
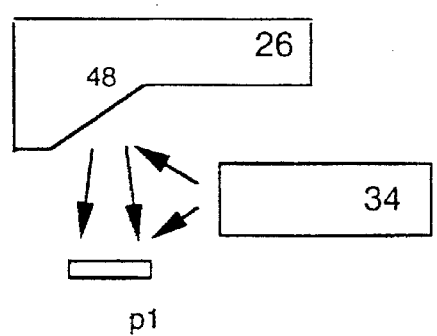

Referring more especially to FIGS. 2, 3 and 4, the mounting position of the photodetector P1 will now be discussed. Laser 30 is mounted upon a laser mounting pad portion 24 put on a single crystal substrate 10, the single crystal substrate having previously been etched. A single mode fibre 32 is shown positioned to receive light from a front facet of the laser. A graded index lens 34 is arranged to direct light both directly on the photodiode P1 and on to the reflecting portion 48 of the silicon reflector 26. The length of the fibre stub determines at what point the output light is emitted. The reflecting portion 26 comprises an angled facet of the silicon substrate 20 and is preferably coated with a high reflectivity coating such as TiAu. The angled portion is etch machined along a {111} plane. As seen from FIG. 4, light is reflected from this reflector portion 48 onto a photodiode P1. Photodiode P1 is a sunken photodiode and is located in the silicon substrate 10. Although FIG. 1 shows both configurations for convenience, two photo diodes would not be employed since the mirror substrate 20 would prevent light being received by a second photo diode.

In the alternative P2 detector position, as shown in FIGS. 1, 5 and 6, the photodiode P2 is mounted in a flip chip fashion, that is the sensor area of the detector faces the V-groove. The photodetector P2 in its own substrate 22 is flipped and then locates into grooves 42 as discussed above. In a similar fashion to the mounting arrangement of the silicon reflector of the P1 detector, passive mounting of the flip chip P2 detector is thereby achieved. This is enabled by the repeatable definition of the V-groove features. Alternatively detector P2 can be mounted in a solder bump stop fashion, in a similar fashion to the mounting of the laser 30. Referring in particular to FIG. 6, it can be seen that the graded index lens focuses light from the back facet of the laser on to a facet of the V-groove (along the {111} plane) opposite the lens; this facet then directs the focused light on to the sensor region of the photodiode P2.

We claim:

1. An injection laser assembly comprising a single crystal substrate upon which an injection laser is mounted, characterised in that the substrate is provided with an etched groove, a graded index lens having an axis, said lens being fixedly located in the etched groove by bump stop techniques wherein radiation from the laser back facet is directed towards the lens, off the axis of the lens, whereby emissions from the back facet are directed at a sensor mounted on the substrate.

2. An injection laser assembly as claimed in claim 1 wherein the sensor is a sunken photodiode and is placed to receive reflected light output from the graded index lens by means of a reflector.

3. An injection laser assembly as claimed in claim 1 wherein the sensor is a sunken photodiode and is placed to receive reflected light output from the graded index lens by means of a reflector, wherein the reflector is mounted upon the single crystal substrate.

4. An injection laser assembly as claimed in claim 1 wherein the sensor is a photodiode having a surface sensor and said sensor is mounted in a flip-chip orientation upon the substrate and is arranged to receive light output from the graded index lens by means of a reflector arrangement.

5. An injection assembly as claimed in claim 1 wherein the sensor is a photodiode having a surface sensor and said sensor is mounted in a flip-chip orientation upon the substrate and is arranged to receive light output from the graded index lens by means of a reflector arrangement, wherein the reflector arrangement comprises a {111} plane face of the crystal substrate and said {111} plane face is placed to reflect light from the graded index lens and direct it at a sensor surface of the photodiode.

6. An injection laser assembly as claimed in claim 1 wherein the sensor is an edge receiving photodiode and is positioned in relation to the graded index lens such that the sensor receives light focused by the lens.

7. An injection laser assembly as claimed in claim 1 wherein the graded index lens comprises a portion of a multimode graded index optical fibre.

\* \* \* \* \*